(12) United States Patent
Ng et al.

(10) Patent No.: US 10,191,661 B1
(45) Date of Patent: Jan. 29, 2019

(54) LUTRAM DUMMY READ SCHEME DURING ERROR DETECTION AND CORRECTION

(71) Applicant: ALTERA CORPORATION, San Jose, CA (US)

(72) Inventors: Bee Yee Ng, Bayan Lepas (MY); Gaik Ming Chan, Butterworth (MY); Jeffrey Christopher Chromczak, Ontario (CA); Herman Henry Schmit, Palo Alto, CA (US)

(73) Assignee: ALTERA CORPORATION, San Jose, CA (US)

( * ) Notice: Subject to any disclaimer, the term of this patent is extended or adjusted under 35 U.S.C. 154(b) by 71 days.

(21) Appl. No.: 15/228,989

(22) Filed: Aug. 4, 2016

(51) Int. Cl.
| G11C 11/419 | (2006.01) |
| G06F 3/06 | (2006.01) |
| G06F 11/10 | (2006.01) |

(52) U.S. Cl.
CPC .............. *G06F 3/061* (2013.01); *G06F 3/064* (2013.01); *G06F 3/0619* (2013.01); *G06F 3/0634* (2013.01); *G06F 3/0659* (2013.01); *G06F 3/0673* (2013.01); *G06F 11/102* (2013.01); *G06F 11/1004* (2013.01); *G11C 11/419* (2013.01)

(58) Field of Classification Search
None
See application file for complete search history.

(56) References Cited

U.S. PATENT DOCUMENTS

| 5,701,267 A | * | 12/1997 | Masuda | ................... | G11C 7/00 365/189.04 |
| 5,933,855 A | * | 8/1999 | Rubinstein | ........... | G05B 19/042 711/200 |

* cited by examiner

*Primary Examiner* — Douglas King
(74) *Attorney, Agent, or Firm* — Fletcher Yoder P.C.

(57) ABSTRACT

An integrated circuit device includes a first memory cell that stores data representative of configuration data when operating in a first mode, wherein the first memory cell stores data representative of user-accessible data when operating in a second mode. The integrated circuit device also includes a second memory cell that stores a value indicating whether the first memory cell is operating in the first mode or is operating in the second mode. The integrated circuit device further includes a switch coupled to the first memory cell and controlled by the second memory cell, wherein the switch provides a defined value to be read in place of the stored data of the first memory cell when the second memory cell stores the value indicating that the first memory cell is operating in the second mode.

13 Claims, 10 Drawing Sheets

US 10,191,661 B1

LUTRAM DUMMY READ SCHEME DURING ERROR DETECTION AND CORRECTION

BACKGROUND

The present disclosure relates generally to a programmable logic device. More particularly, the present disclosure relates to a logic array block (LAB) in the programmable logic device that uses look-up table (LUT)-based random access memory (RAM).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Programmable logic fabric of an integrated circuit device may be programmed to implement a programmable circuit design to perform a wide range of functions and operations. The programmable logic fabric may include logic array blocks (LABs) that have lookup tables (LUTs) that can be configured to operate as different logic elements based on the configuration data programmed into memory cells in the LAB s. These memory cells store may store configuration data and be referred to as configuration random access memory (CRAM).

Some types of LABs, which may be referred to as memory logic array blocks (MLABs), can operate in either a lookup-table mode (LUT-mode) or a memory mode such as random access memory mode (RAM-mode) or shift-register (DLM) mode. MLABs have memory cells which may be referred to generally as lookup table random access memory (LUTRAM). When operating in the lookup-table mode, the LUTRAM memory cell(s) of an MLAB store configuration data that define the operation of the LUT of the MLAB. Thus, in the lookup-table mode, the MLAB can be programmed to represent combinational logic of the programmable circuit design, in similar fashion to other LABs. When operating in the memory mode, the LUTRAM memory cell(s) of the MLAB operate as cells of random access memory or as cells of a shift register that hold user data. Thus, in the memory mode, the MLAB operates like random access memory or a shift register. By selectively storing either configuration data or user data, the MLABs may operate either as configurable logic or as a cell of user-accessible memory depending on the programmable circuit design that is in use. This may allow programmable circuit designs to take advantage of the MLAB memories to store user data when the MLABs are not used as combinational logic of the programmable circuit design.

It may be useful to verify the integrity of a programmable circuit design that has been programmed into the LABs (which includes MLABs operating in LUT-mode) of the programmable logic fabric. Since the programmable circuit design is based on the configuration data programmed into the LABs, any deviations from the expected values of the configuration data may suggest that the programmable logic fabric has been corrupted or tampered with. If the programmable logic fabric has been corrupted or tampered with, the programmable logic design may not perform as expected. Accordingly, error detection/correction may be performed on the cells of the programmable logic fabric. The configuration data stored in the CRAM memory cells of the LABs (and the LUTRAM memory cells of the MLABs operating in LUT-mode) may be static for any particular programmable circuit design and, as such, should not change during operation of the programmable logic fabric configured with the programmable circuit design. An error may thus be properly detected/corrected when the configuration data stored in an LAB or MLAB memory cell changes (without authorization and/or acknowledgement). However, user data stored in an MLAB memory cell is dynamic and may regularly change. As such, an error may be detected when the user data stored in the memory cell changes, and the user data may be rewritten due to error correction. Without distinguishing between configuration data and user data stored in the MLAB memory cells, changes in the data stored in the MLAB memory cells may be improperly and repeatedly detected without acknowledging whether the changes are to the configuration data or user data.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems and devices for providing dummy read values during error detection/correction operations performed on memory cells of look-up tables in a logic array block of a programmable logic device when the memory cells are used to store dynamic user data. Because these dummy read values are static and known in advance, error detection/correction of the memory cells can identify when the normally static configuration data has changed (without authorization and/or acknowledgement), even when some of the memory cells are being used to store dynamic user data.

In a first embodiment, an integrated circuit device includes a first memory cell that stores data representative of configuration data when operating in a first mode, wherein the first memory cell stores data representative of user-accessible data when operating in a second mode. The integrated circuit device also includes a second memory cell that stores a value indicating whether the first memory cell is operating in the first mode or is operating in the second mode. The integrated circuit device further includes a switch coupled to the first memory cell and controlled by the second memory cell, wherein the switch provides a defined value to be read in place of the stored data of the first memory cell when the second memory cell stores the value indicating that the first memory cell is operating in the second mode.

In a second embodiment, an integrated circuit device includes a first memory cell that stores static and dynamic data. The integrated circuit device also includes a second memory cell that stores a value indicating whether the first memory cell is storing the static data or the dynamic data. The integrated circuit device further include a transistor coupled to the first memory cell and controlled by the second memory cell, wherein the transistor provides a defined value to be read in place of the dynamic data stored in the first memory cell when the second memory cell stores the value indicating that the first memory cell is storing the dynamic data.

In a third embodiment, a method includes initiating memory data readout for error checking of an integrated circuit device comprising a memory cell. The method also includes determining whether the memory cell is storing user data. The method further includes reading out dummy data in place of the user data stored in the memory cell when the memory cell stores the user data. The method also includes reading out data stored in the memory cell when the memory cell does not store the user data. The method further includes performing the error checking of the integrated circuit device.

Various refinements of the features noted above may be made in relation to various aspects of the present disclosure. Further features may also be incorporated in these various aspects as well. These refinements and additional features may be made individually or in any combination. For instance, various features discussed below in relation to one or more of the illustrated embodiments may be incorporated into any of the above-described aspects of the present invention alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
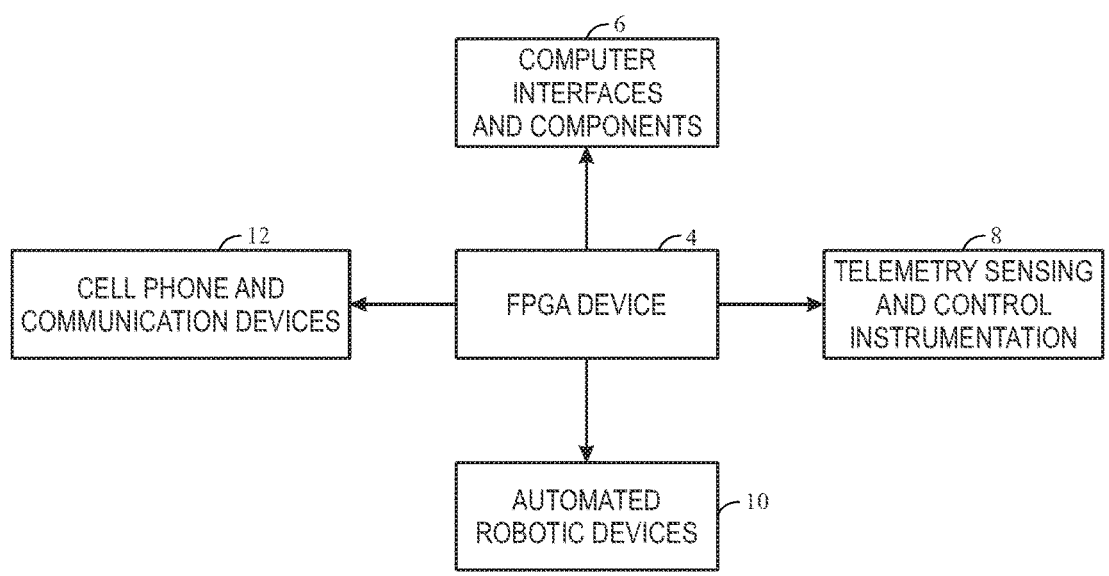
FIG. 1 is a block diagram illustrating non-limiting uses of a programmable logic device (e.g., a field programmable gate array (FPGA) device), in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As mentioned above, programmable logic fabric of an integrated circuit device may be programmed to implement a programmable circuit design to perform a wide range of functions and operations. The programmable logic fabric may include logic array blocks (LABs) that have lookup tables (LUTs) that can be configured to operate as different logic elements based on the values programmed into memory cells in the LABs. These memory cells may store configuration data and may be referred to as configuration random access memory (CRAM).

Some types of LABs, which may be referred to as memory logic array blocks (MLABs), can operate in either a lookup-table mode (LUT-mode) or a memory mode such as random access memory mode (RAM-mode) or shift-register (DLM) mode. MLABs have memory cells which may be referred to generally as lookup table random access memory (LUTRAM). When operating in the lookup-table mode, the LUTRAM memory cell(s) of an MLAB store configuration data that define the operation of the LUT of the MLAB. Thus, in the lookup-table mode, the MLAB can be programmed to represent combinational logic of the programmable circuit design, in similar fashion to other LABs. When operating in the memory mode, the LUTRAM memory cell(s) of the MLAB operate as cells of random access memory or as cells of a shift register that hold user data. Thus, in the memory mode, the MLAB operates like random access memory or a shift register. By selectively storing either configuration data or user data, the MLABs may operate either as configurable logic or as a cell of user-accessible memory depending on the programmable circuit design that is in use. This may allow programmable circuit designs to take advantage of the MLAB memories to store user data when the MLABs are not used as combinational logic of the programmable circuit design.

Embodiments of the present disclosure relate to providing dummy read values when LUTRAM cells store dynamic user data. Because these dummy read values are static and known in advance, when error detection/correction or similar operations are performed on the programmable logic device, any unexpected changes in configuration data can be identified. The dummy read values may be provided via a transistor added at a read port of a LUTRAM cell, via a transistor added at a data line across multiple LUTRAM cells on the same data line, or via a transistor added at a sector data line across multiple data lines across of multiple LUTRAM cells. In this manner, read address-line gating logic may be avoided, saving valuable die space from the MLAB associated with the LUTRAM cell. Avoiding read address-line gating logic from each LUTRAM cell enables a smaller MLAB. Additionally, power leakage in the MLAB may be reduced by avoiding using read address-line gating logic in each LUTRAM cell.

Keeping this in mind, FIG. 1 is a block diagram illustrating non-limiting uses of a programmable logic device (PLD) (e.g., a field programmable gate array (FPGA) device 4), in accordance with an embodiment of the present disclosure. The FPGA device 4 may be used in any suitable device that may in turn use a configurable integrated circuit with the added benefit of flexibility from using the FPGA device 4. For example, the FPGA device 4 may be used in computer interfaces and components 6. The FPGA device 4 may also be used in telemetry, sensing, and control instrumentation 8. In some embodiments, the FPGA device 4 may be used in automated robotic devices 10. The FPGA device 4 may also be used in cell phone and communication devices 12.

Figure 2:
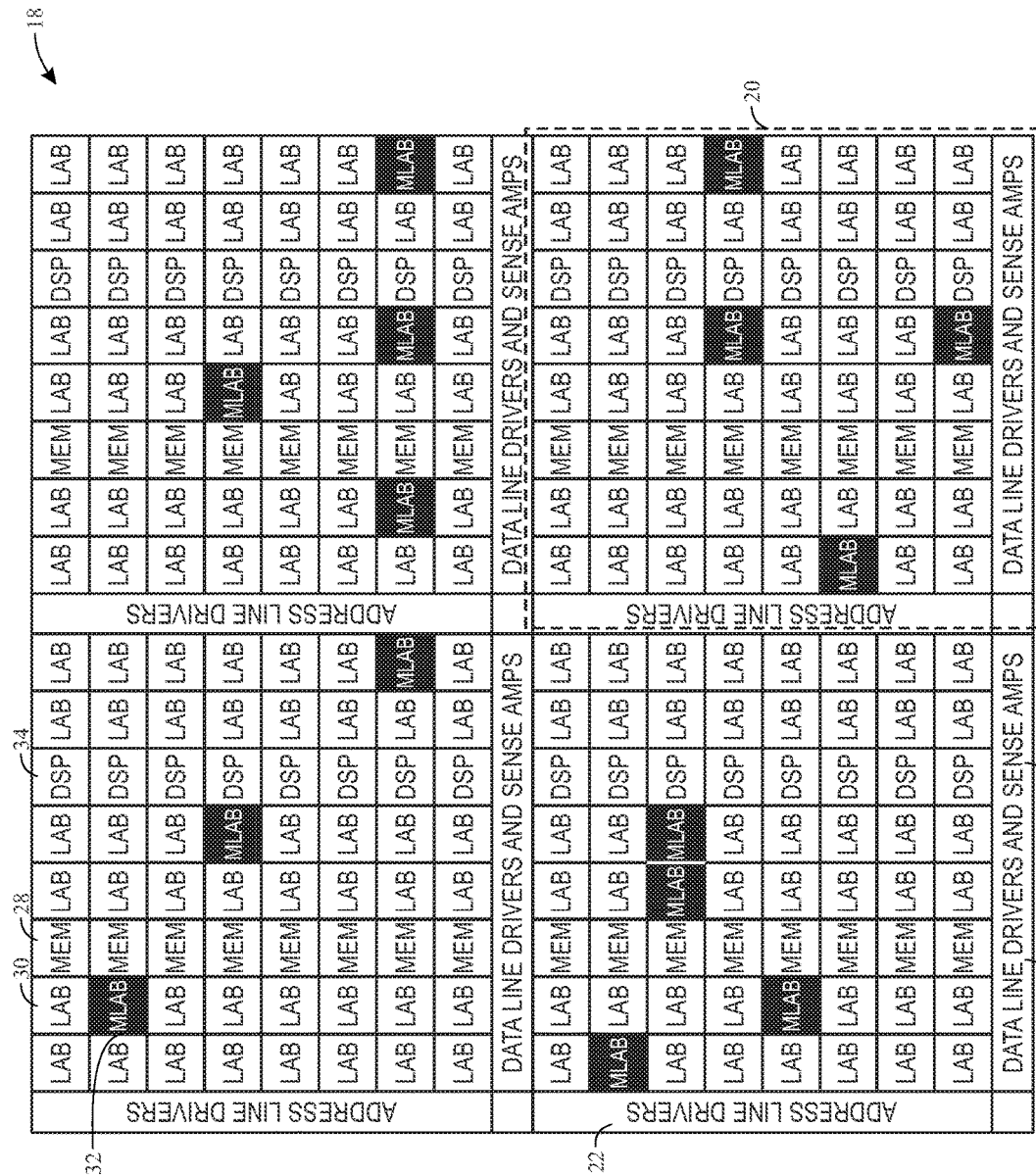
FIG. 2 is a schematic diagram of programmable logic fabric of the FPGA device of FIG. 1, in accordance with an embodiment of the present disclosure.

FIG. 2 is a schematic diagram of programmable logic fabric 18 of the FPGA device 4 of FIG. 1, in accordance with an embodiment of the present disclosure. The programmable logic fabric 18 may be divided into sectors (e.g., 20) of resources and/or components. In some embodiments, the each sector includes approximately equal resource and/or component distribution. The programmable logic fabric 18 may include address line drivers 22 that drive address information associated with components of the programmable logic fabric 18 via address lines. The programmable logic fabric 18 may also include data line drivers 24 and sense amplifiers 26 that drive data to and from the components of the programmable logic fabric 18. The data line drivers 24 may drive the data to and from the components of the programmable logic fabric 18 via data lines. The sense amplifier may sense a low power signal from a bitline that represents a data bit (1 or 0) stored in a memory cell 28 of the programmable logic fabric 18, and amplify the corresponding small voltage swing to recognizable logic levels so that the data can be interpreted by logic outside the memory cell 28.

The components of the programmable logic fabric 18 may include one or more logic array blocks (LABs) 30 and/or one or more memory LABs (MLABs) 32 that provide interconnections for logic elements within each respective LAB 30 or MLAB 32. Each LAB 30 or MLAB 32 may include one or more look-up tables (LUTs) that may be used to replicate a logic gate configured to perform a certain function with a certain number of inputs. A LUT in a LAB 30 may be configured and/or controlled by configuration data stored in a CRAM cell, and a LUT in an MLAB 32 may be configured and/or controlled by configuration data stored in a LUTRAM cell. Additionally, the LUTRAM cell in the MLAB 32 may be used to store user-accessible data when the LUTRAM cell in the MLAB 32 is not used to store configuration data (e.g., when the corresponding LUT is not being used). The components of the programmable logic fabric 18 may also include one or more digital signal processing (DSP) blocks 34 to perform DSP functions.

Figure 3:
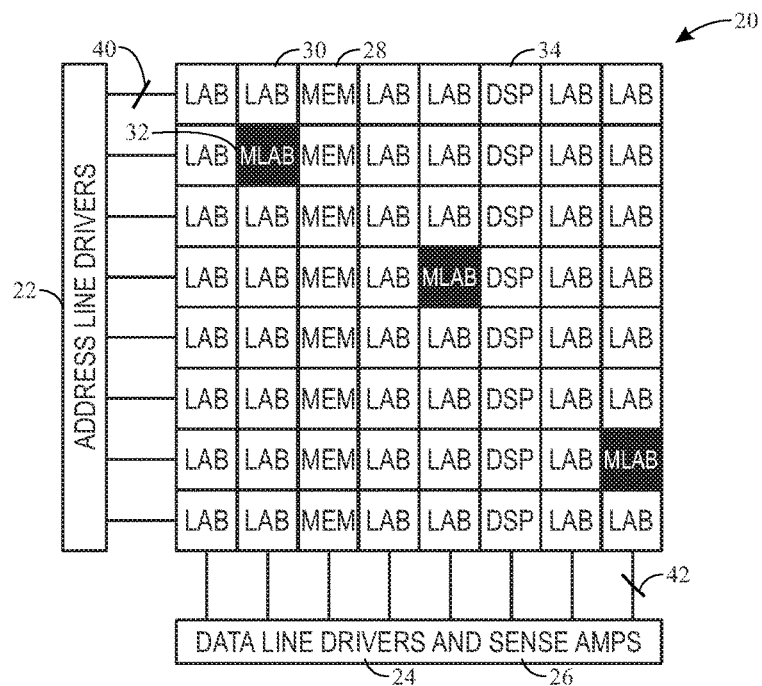
FIG. 3 is a schematic diagram of a sector of the programmable logic fabric of FIG. 2, in accordance with an embodiment of the present disclosure.

FIG. 3 is a schematic diagram of the sector 20 of the programmable logic fabric 18 of FIG. 2, in accordance with an embodiment of the present disclosure. The sector 20 includes address lines 40 of the programmable logic fabric 18. The address line drivers 22 may drive address information to components of the programmable logic fabric 18 via the address lines 40. Each illustrated address line 40 may indicate one or more address lines of the programmable logic fabric 18. The sector 20 also includes data lines 42 of the programmable logic fabric 18. The data line drivers 24 may drive data to and from the components of the programmable logic fabric 18 via the data lines 42. Each illustrated data line 42 may indicate one or more data lines of the programmable logic fabric 18.

Figure 4:
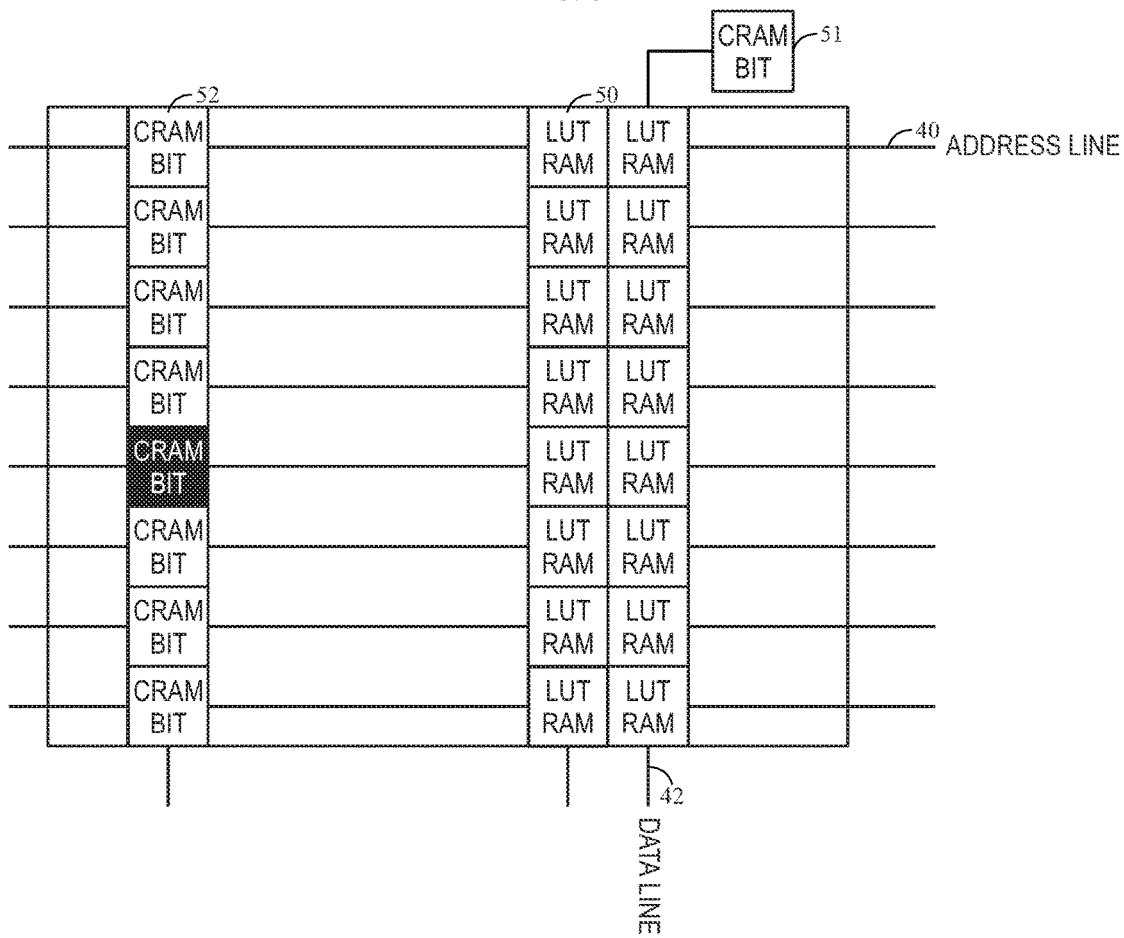
FIG. 4 is a schematic diagram of memory cells of the sector of FIG. 3, in accordance with an embodiment of the present disclosure.

FIG. 4 is a schematic diagram of memory cells 50, 52 of the sector 20 of FIG. 3, in accordance with an embodiment of the present disclosure. As illustrated, the memory cells of the sector 20 may include CRAM cells or bits 52 that may configure and/or control a LUT in the LAB 30. The memory cells of the sector 20 may also include LUTRAM cells or bits 50 that may configure and/or control a LUT in the MLAB 32. The memory cells 50, 52 may be organized into rows, such that each memory cell 50, 52 in a row of memory cells may be identified via address information provided in a corresponding address line 40. The memory cells 50, 52 may also be organized into columns, such that each memory cell 50, 52 in a column of memory cells may input and/or output a value via a corresponding data line 42.

The LUTRAM cells 50 may function as user-accessible (e.g., via a read/write operation) memory cells (e.g., static RAM (SRAM) cells) when not performing LUT-related functions. For instance, a LUTRAM cell 50 may not be performing LUT-related function when a LUT in a respective MLAB 32 associated with the LUTRAM cell 50 is not used. In some embodiments, memory cells (e.g., of the MLAB 32) may include storage identifier memory cells (e.g., CRAM cells) that store a value indicative of whether one or more respective LUTRAM cells 50 is storing configuration data or user data. As illustrated, a CRAM cell 51 stores a value indicative of whether a coupled LUTRAM cell 50 is storing configuration data or user data. However, when error detection/correction is performed on the LUTRAM cell 50 and the LUTRAM cell 50 is being used to store user data, an error may be detected because a value of the LUTRAM cell 50 has changed. Undesirably, user data stored in the LUTRAM cell 50 may be rewritten in an effort to correct the detected error. Read address-line gating logic may be added to an MLAB 32 associated with the LUTRAM cell 50 to disable read/write access to the LUTRAM cell 50 during error detection/correction operations so that the user data in the LUTRAM cell 50 may not be detected and/or overwritten. For example, the read address-line gating logic may be configured to gate a read address line (e.g., 40) of the LUTRAM cell 50 off during an error detection/correction operation, such that a read port of the LUTRAM cell 50 is disabled. However, the read address-line gating logic occupies valuable surface area on the MLAB 32. Additionally, with an increasing number of components in and processes performed by the programmable logic fabric 18, the address lines (e.g., 40) of the programmable logic fabric 18 use higher voltage differences to reliably read and write cells. Because local address gates may not be capable of producing the higher voltage differences, the higher voltage differences may be implemented in a periphery of the programmable logic fabric using extra voltage supplies. As a result, use of the read address-line gating logic may lead to power leakage.

Figure 5:
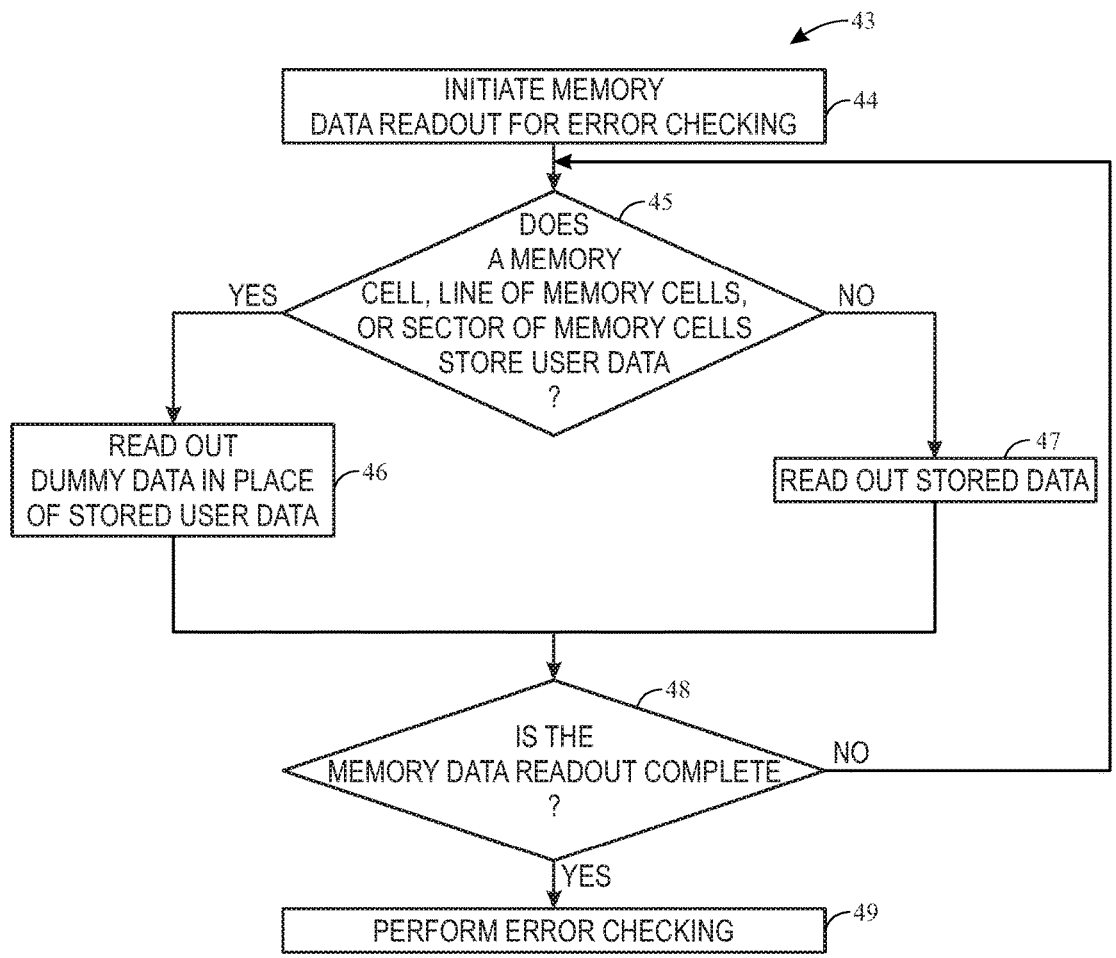
FIG. 5 is a flowchart of a method for providing dummy read values error checking on a memory cell of FIG. 4 when the memory cell is configured to store user data, in accordance with an embodiment of the present disclosure.

FIG. 5 is a flowchart of a method 43 for providing dummy read values for error checking performed on a LUTRAM cell 50 of FIG. 4 when the LUTRAM cell 50 is configured to store user data, in accordance with an embodiment of the present disclosure. The method 43 may be performed by, for example, circuitry in the FPGA device 4 that includes the programmable logic fabric 18. The circuitry in the FPGA device 4 initiates (block 44) a memory readout for error checking. That is, the error checking is performed on data readout from memory. The memory may be a single memory cell, a line of memory cells, or a sector of memory cells. The error checking may be performed on each cell of the programmable logic fabric 18, including CRAM cells 52 and LUTRAM cells 50. In some embodiments, the error checking may be performed only on each memory cell of the programmable logic fabric 18, including CRAM cells 52 and LUTRAM cells 50. Initiating the memory readout may include, for example, determining memory addresses to be checked for errors.

The circuitry in the FPGA device 4 determines (node 45) whether the memory cell, the line of memory cells, or the sector of memory cells stores user data. In some embodiments, this may be determined by reading a value stored in a corresponding storage identifier memory cell (e.g., the CRAM cell 51). The storage identifier memory cell may store a value indicative of whether a LUTRAM cell 50, a line of LUTRAM cells 50, or a sector of LUTRAM cells 50 is storing configuration data or user data. If the memory cell, the line of memory cells, or the sector of memory cells stores user data, the circuitry in the FPGA device 4 reads out (block 46) dummy data in place of the stored user data. As discussed in further detail below, the circuitry in the FPGA device 4 may provide the dummy read value(s) via a switch, such as a transistor, added at a read port of the LUTRAM cell 50, a switch added at a data line across multiple LUTRAM cells 50 on the same data line, or a switch added at a sector data line across multiple data lines across of multiple LUTRAM cells 50. The method 43 then proceeds to node 48, as described below.

If the circuitry in the FPGA device 4 determines that the memory cell, the line of memory cells, or the sector of memory cells does not store user data, the circuitry in the FPGA device 4 reads out (block 47) the stored data (e.g., configuration data). The circuitry in the FPGA device 4 then determines (node 48) whether the memory data readout operation is complete. If not, the method 43 returns to node 45. If the memory data readout operation is complete, the circuitry in the FPGA device 4 performs (block 49) the error checking operation. The error checking may confirm whether the data stored in the memory cells is correct. For example, the error checking may detect single event upsets (SEUs) that include changes (e.g., unauthorized changes) in state of a storage element in the FPGA device 4. In some embodiments, the circuitry performing the error checking operation is built into the FPGA device 4. The error checking operation may include a cyclic redundancy check (CRC) that includes calculating, transmitting, and comparing a checksum value based on transmitted data. The error checking may occur continuously and/or automatically.

The method 43 enables the circuitry in the FPGA device 4 to perform error checking on the dummy read value(s), rather than the value stored in the LUTRAM cell 50, when the LUTRAM cell 50 stores dynamic user data. As a result, an error may not be detected in the LUTRAM cell 50 and the user data stored in the LUTRAM cell 50 may not be overwritten by an error correction operation. In this manner, read address-line gating logic may not be used, and thus removed, from the MLAB 32 associated with the LUTRAM cell 50. Removal of the read address-line gating logic from each LUTRAM cell 50 enables a smaller MLAB 32. Additionally, power leakage in the MLAB 32 may be reduced by removing the read address-line gating logic in each LUTRAM cell 50.

Figure 6:
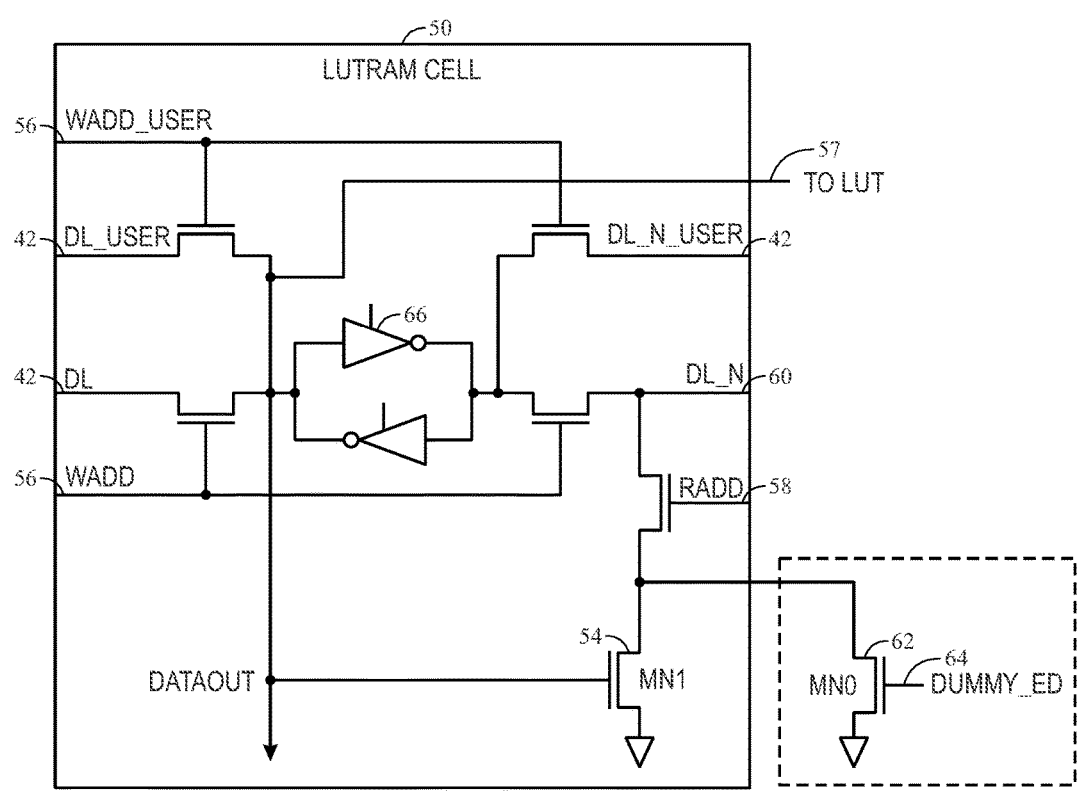
FIG. 6 is a circuit diagram of a memory cell used in the method of FIG. 5, in accordance with an embodiment of the present disclosure.

FIG. 6 is a circuit diagram of a LUTRAM cell 50 configured to perform the method 43 of FIG. 5, in accordance with an embodiment of the present disclosure. The LUTRAM cell 50 may use components, such as cross-coupled inverters 66, to store a value. As illustrated, the LUTRAM cell 50 includes address lines 40. Write address lines 56 (e.g., WADD_USER, WADD) may be used to identify the LUTRAM cell 50 to write data to the LUTRAM cell 50. The write address lines 56 may be used to identify the LUTRAM cell 50 to write data (e.g., WADD) to the LUTRAM cell 50 when the corresponding LUT is used (e.g., when the LUTRAM cell 50 is operating in a "LUT mode"), and identify the LUTRAM cell 50 to write user data (e.g., WADD_USER) to the LUTRAM cell 50 when the corresponding LUT is not used (e.g., when the LUTRAM cell 50 is operating in a "RAM mode"). A read address line 58 (e.g., RADD) may be used to identify the LUTRAM cell 50 to read data from the LUTRAM cell 50. The LUTRAM cell 50 may include a data line 57 that enables the state of the cross-coupled inverters 66 to be read out to an element that may be configured by the LUTRAM cell 50, such as the corresponding LUT. As illustrated, the LUTRAM cell 50 may also include data lines 42 (e.g., DL, DL_N, DL_USER, and DL_N_USER). Data line 60 (e.g., DL_N) may be used to read data stored in the LUTRAM cell 50 via the read address line 58 by a data register of the programmable logic fabric 18. In some embodiments, the LUTRAM cell 50 operates in the LUT mode when a respective MLAB 32 that includes the LUTRAM cell 50 operates in the LUT mode, and the LUTRAM cell 50 operates in the RAM mode when the respective MLAB 32 operates in the RAM mode.

The LUTRAM cell 50 may be electrically coupled to a switch or transistor 62 (e.g., MN0). As illustrated, the transistor 62 is electrically coupled to the LUTRAM cell 50 at a read port of the LUTRAM cell 50. Transistors 54 (e.g., MN1) and 62 may be n-channel MOSFET (NMOS) pull-down transistors. When the LUTRAM cell 50 is operating in the RAM mode and an error detection/correction operation is being performed (e.g., via a read operation using the read address line 58), a control signal 64 (e.g., dummy_ed) of the transistor 62 is asserted (i.e., active high). When the LUTRAM cell 50 stores a low (i.e., 0) value, the transistor 62 may cause the data line 60 to pull down (e.g., short to a ground). When the LUTRAM cell 50 stores a high (i.e., 1) value, the transistors MN0 62 and MN1 54 may pull down the data line 60. A data register reading the data line 60 of the LUTRAM 50 via the read address line 58 when the LUTRAM cell 50 is operating in the RAM mode and the error detection/correction operation is being performed receives the low value. The low value output may then be sent for error detection/correction. As such, an error may not be detected in the LUTRAM cell 50 and the user data stored in the LUTRAM cell 50 may not be overwritten by an error detection/correction operation, and read address-line gating logic may not be used, and thus removed, from the MLAB 32 associated with the LUTRAM cell 50.

Figure 7:
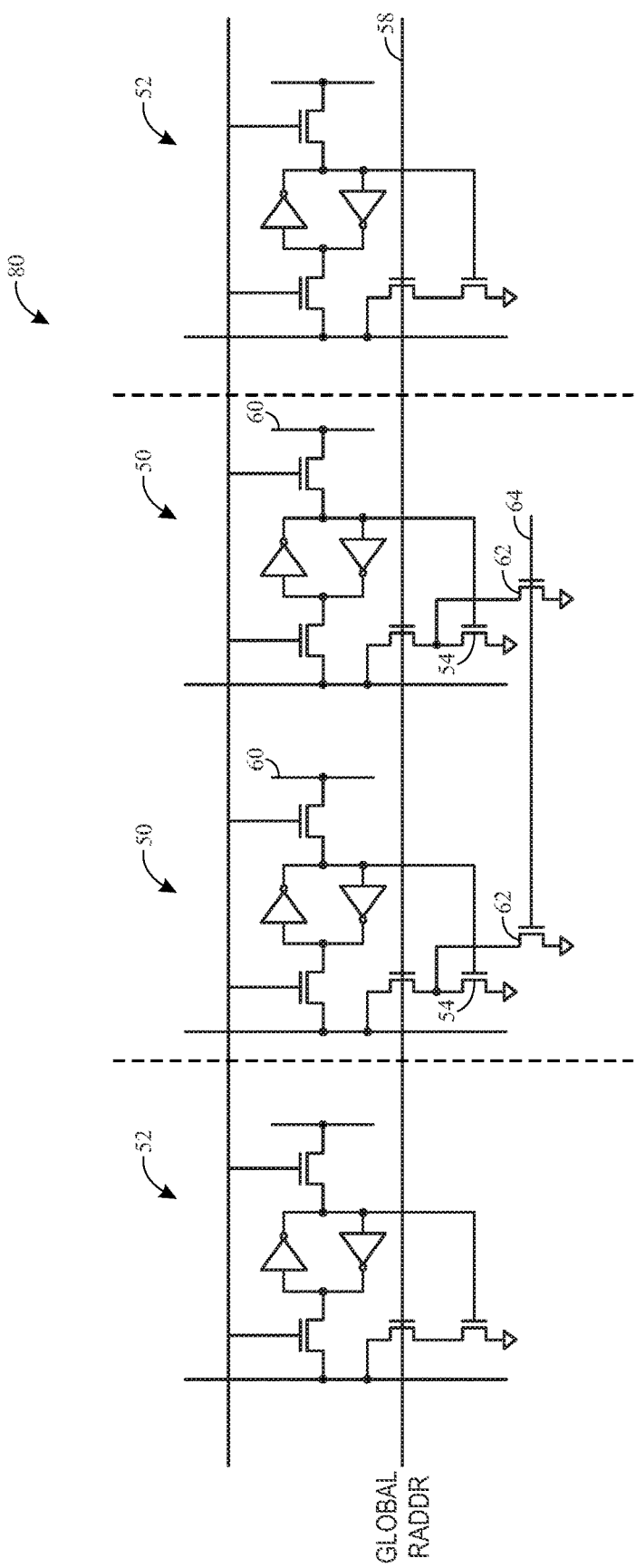
FIG. 7 is a schematic diagram of a row of memory cells, including a row of memory cells used in the method of FIG. 5, in accordance with an embodiment of the present disclosure.

FIG. 7 is a schematic diagram of a row 80 of memory cells, including a row of LUTRAM cells 50 each configured to perform the method 43 of FIG. 5, in accordance with an embodiment of the present disclosure. In some embodiments, the memory cells may be in a column, or any suitable line such that the memory cells share a data line. The row 80 includes the LUTRAM cells 50 that are each electrically coupled to a transistor 62 that provides the dummy read values during error detection/correction operations performed on the LUTRAM cell 50 when the LUTRAM cell 50 is used to store user data. As discussed above, when each LUTRAM cell 50 is operating in the RAM mode and an error detection/correction operation is being performed, the control signal 64 of the transistor 62 is asserted such that the data line 60 is pulled down. Reading the data line 60 of each LUTRAM 50 via the read address line 58 results in low (dummy) values. An error may thus not be detected in the LUTRAM cell 50 and the user data stored in the LUTRAM cell 50 may not be overwritten by the error detection/correction operation. As illustrated, the row 80 of memory cells may also include CRAM cells 52 that may configure or control one or more of the LUTRAM cells 50 in the row 80. It should be noted that any number of LUTRAM cells 50 (e.g., 1-100) may be associated with a CRAM cell 52.

Figure 8A:
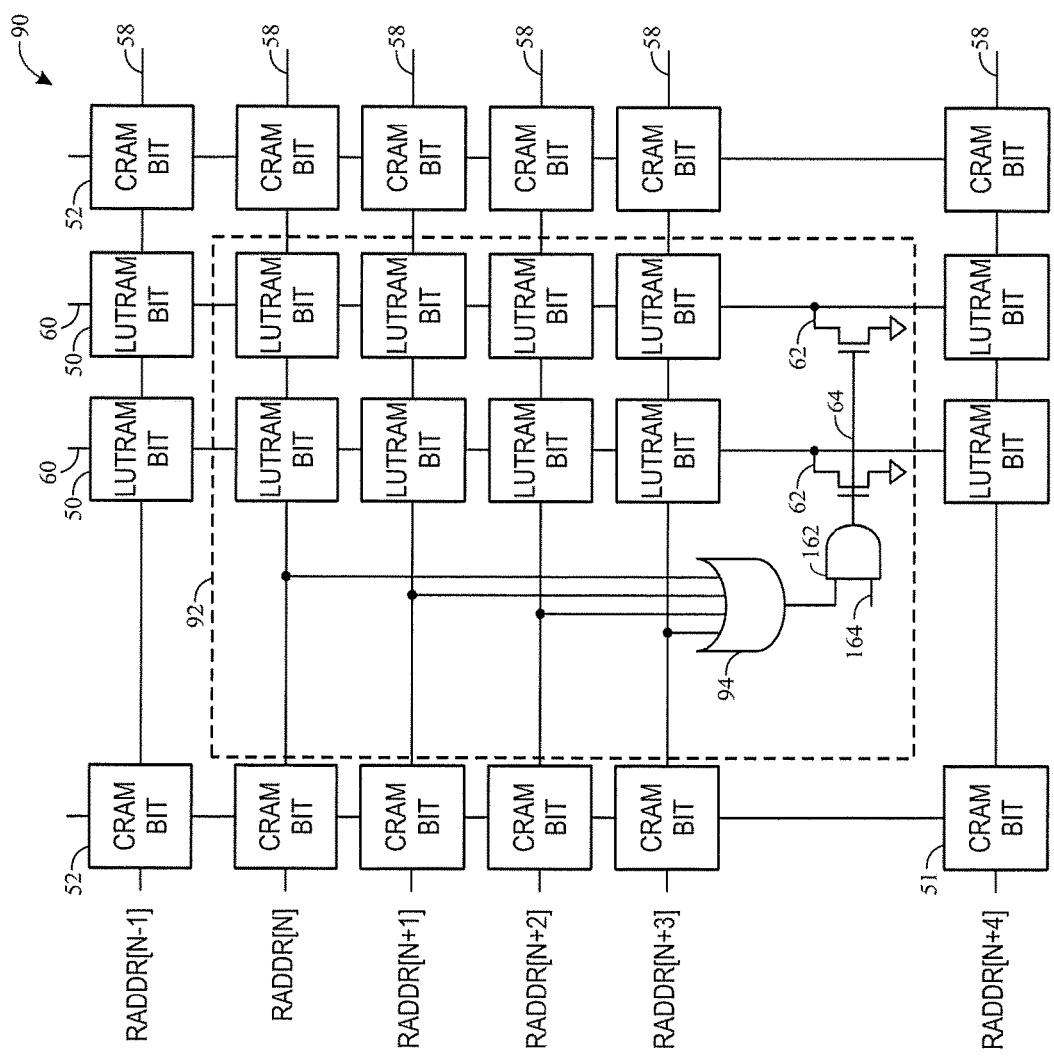
FIG. 8A is a schematic diagram of multiple rows of memory cells, including multiple rows of memory cells that may store either configuration data or user data, in accordance with an embodiment of the present disclosure.

FIG. 8A is a schematic diagram of multiple rows 90 of memory cells, including multiple rows of LUTRAM cells 50, in accordance with an embodiment of the present disclosure. As illustrated, each column of LUTRAM cells 50 (in a region 92) share a transistor 62 that provides the dummy read values during error detection/correction operations performed on the LUTRAM cell 50 when the LUTRAM cell 50 is used to store user data. A CRAM cell 51 may store a value indicative of whether the LUTRAM cells 50 in the region 92 stores user data, as discussed above with respect to FIG. 4. Using gating logic 94 (e.g., an OR gate) and switch logic 162 (e.g., an AND gate), if a LUTRAM cell 50 in a row of LUTRAM cells 50 (in the region 92) is read (as determined by the gating logic 94 via a respective read address line 58 associated with the row of LUTRAM cells 50) and the LUTRAM cell 50 stores user data (as determined by an indicator signal 164 provided by, for example, a bit stored in CRAM cell 51), control signal 64 to be asserted (e.g., by an address register of the programmable logic fabric 18) when the row of LUTRAM cells 50 is operating in the RAM mode and an error detection/correction operation is being performed. Note that indicator signal 164 may be asserted during the error detection/correction operation. As a result, each data line 60 associated with the LUTRAM cells 50 (in the region 92) is pulled down, and reading each data line 60 results in low values. The low value outputs may then be sent for error detection/correction. In some embodiments, the dummy read scheme as illustrated in FIG. 8A may be implemented to all LUTRAM cells 50 of an MLAB 32. Errors may thus not be detected in the LUTRAM cells 50 of the MLAB 32 and user data stored in the LUTRAM cell 50 may not be overwritten by the error detection/correction operation.

Figure 8B:
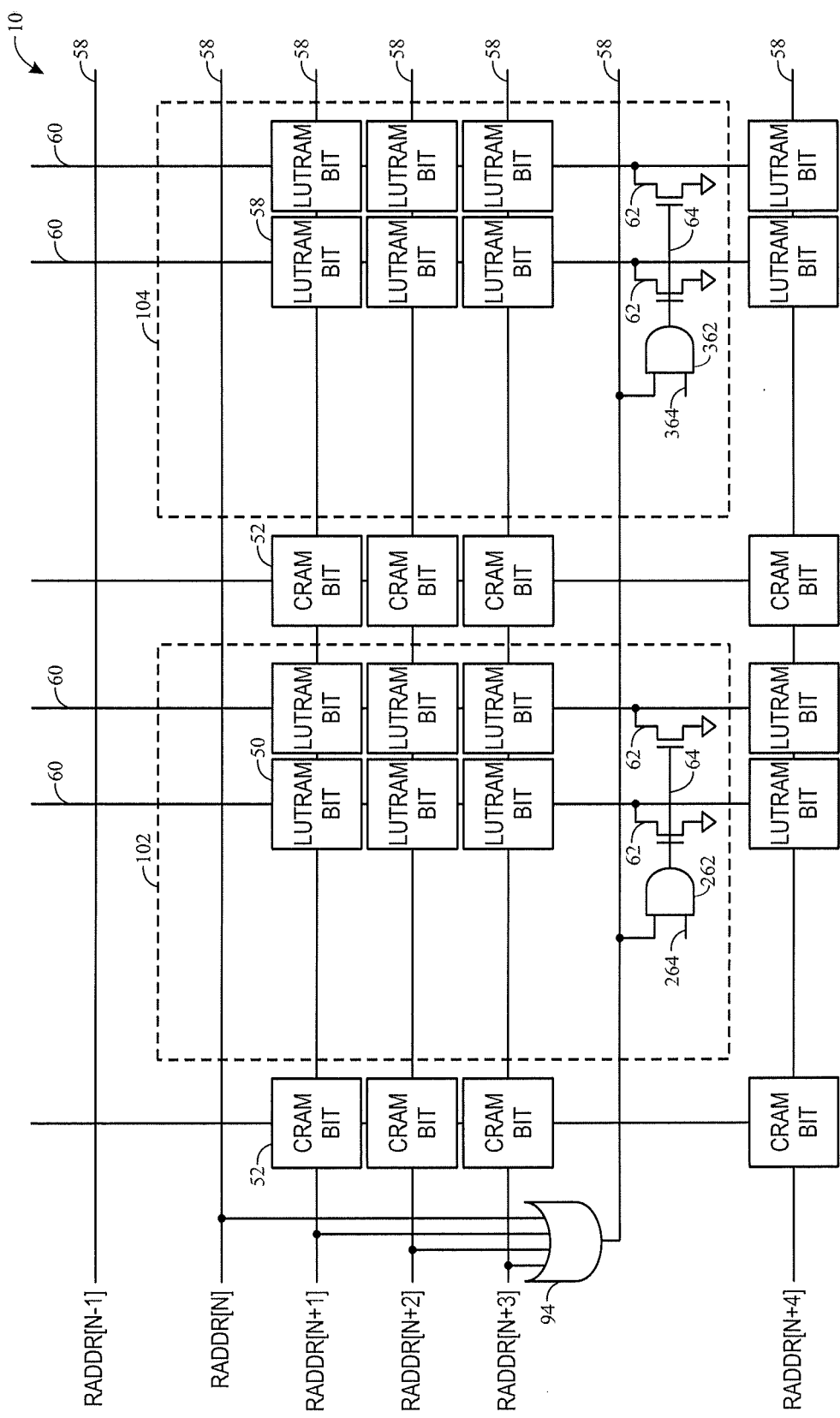
FIG. 8B is a schematic diagram of multiple rows of memory cells, including multiple rows of memory cells that may store either configuration data or user data, in accordance with an embodiment of the present disclosure.

FIG. 8B is a schematic diagram of multiple rows 100 of memory cells, including multiple rows of LUTRAM cells 50, in accordance with an embodiment of the present disclosure. As illustrated, each column of LUTRAM cells 50 (in regions 102, 104) shares a transistor 62 that provides the dummy read values during error detection/correction operations performed on the LUTRAM cell 50 when the LUTRAM cell 50 is used to store user data. CRAM bits in the programmable logic fabric 18 may be used to store information regarding whether user data or configuration data, as discussed above. Using gating logic 94 (e.g., an OR gate) and switch logics 262 and 362 (e.g., AND gates), if a LUTRAM cell 50 in a row of LUTRAM cells 50 (in region 102 and/or 104) is read (as determined via a respective read address line 58 associated with the row of LUTRAM cells 50), a control signal 64 may be asserted (e.g., by an address register of the programmable logic fabric 18) when the row of LUTRAM cells 50 is operating in the RAM mode and an error detection/correction operation is being performed. Control signal 64 may be asserted by the switch logics 262 and 362 based on the output of the gating logic 94 and indicator signals 262 and 362. Indicator signals 262 may be asserted based on whether an error detection/correction operation is being performed and/or based on a bit stored in CRAM bit(s) associated to regions 102 and 104 in the programmable logic fabric 18, as discussed above. Each data line 60 associated with the LUTRAM cells (in region 102 and/or 104) is pulled down, and reading each data line 60 results in low values. The low value outputs may then be sent for error detection/correction. Errors may thus not be detected in the LUTRAM cell 50 and user data stored in the LUTRAM cell 50 may not be overwritten by the error detection/correction operation. As such, the dummy read scheme as illustrated in FIG. 8B may be implemented to enable one group of LUTRAM cells 50 of an MLAB 32 to store user data and provide dummy read values independently from another group of LUTRAM cells 50 (e.g., in the same MLAB 32). In some embodiments, the dummy read scheme may be implemented to 3, 4, 5, or more groups of LUTRAM cells 50. The dummy read scheme may be implemented in a single MLAB 32, or over multiple MLABs 32. For example, one group (e.g., region 102) of LUTRAM cells 50 in an MLAB 32 may operate in LUT mode (e.g., wherein the respective control signal 264 is not asserted during an error detection/correction operation), while another group (e.g., region 104) of LUTRAM cells 50 in the MLAB 32 may operate in RAM mode (e.g., wherein the respective control signal 364 is asserted during the error detection/correction operation).

Figure 9:
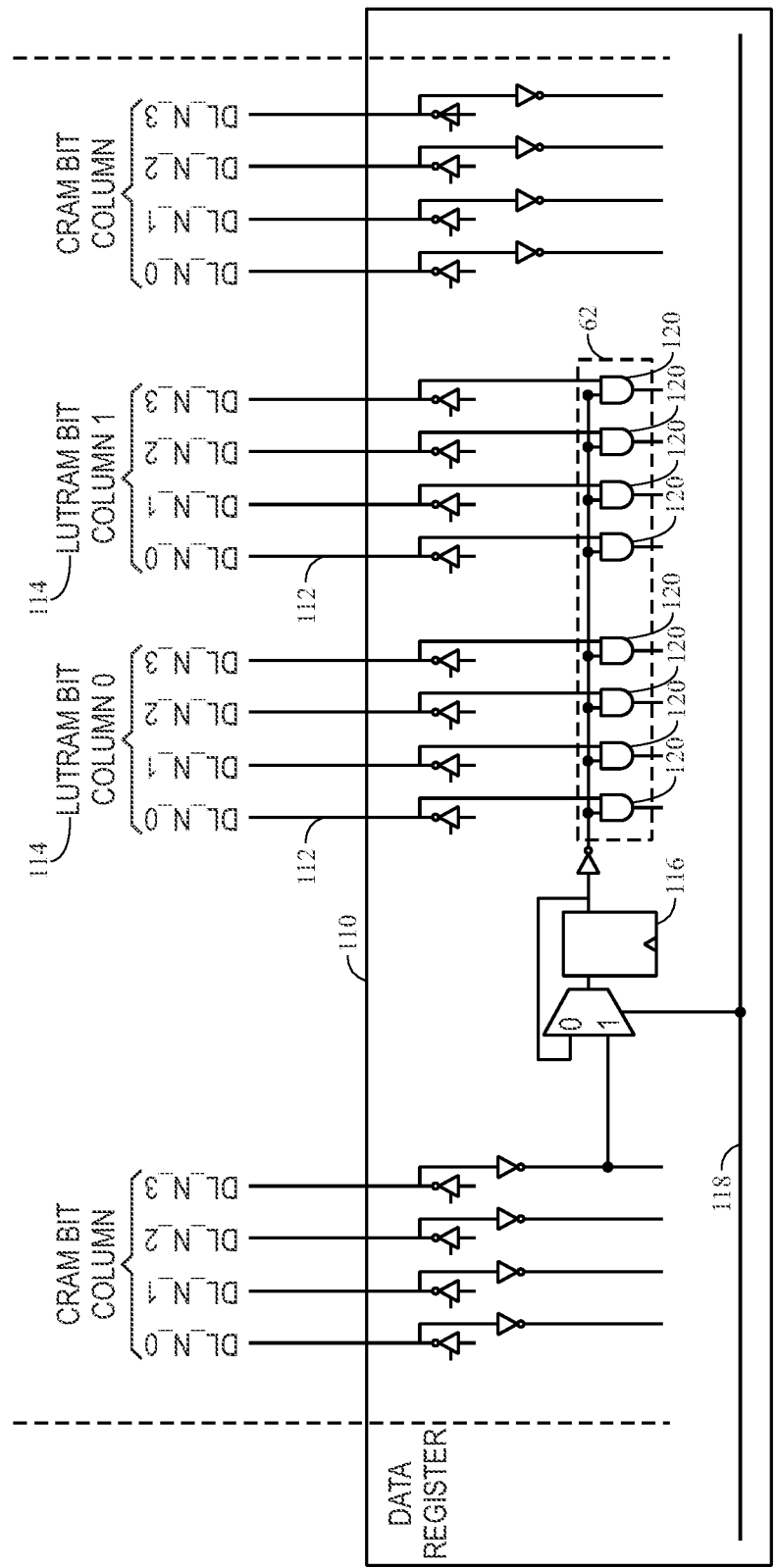
FIG. 9 is a schematic diagram of multiple data lines of memory cells, including multiple data lines from columns of memory cells that may store either configuration data or user data, in accordance with an embodiment of the present disclosure.

FIG. 9 is a schematic diagram of multiple data lines 110 of memory cells, including multiple data lines 112 from columns 114 of LUTRAM cells 50, in accordance with an embodiment of the present disclosure. As illustrated, data lines 112 of columns 114 of LUTRAM cells 50 are coupled to the transistor 62 as described above or gating logic that provides the dummy read values during error detection/correction operations performed on the LUTRAM cell 50 when the LUTRAM cell 50 is used to store user data. For example, the gating logic may gate off values of the data lines 112 from being read. A control signal 118 may be asserted when at least one LUTRAM cell 50 is operating in the RAM mode and an error detection/correction operation is being performed. In some embodiments, an MLAB 32 may include the LUTRAM cells 50, and the MLAB 32 may be configured in the LUT mode or the RAM mode. The control signal 118 may then be based on the MLAB 32 configuration. The control signal 118 may be generated by an address register or a local sector manager of the programmable logic fabric 18. Using gating logic 116 (e.g., multiplexers, registers, etc.), the control signal 118 may be applied to the transistor 62 or the gating logic. When the control signal 118 is asserted, each data line 112 of the columns 114 of LUTRAM cells 50 may be pulled down, and reading the outputs 120 results in low values. The low value outputs 120 may then be sent for error detection/correction. Errors may thus not be detected in the LUTRAM cells 50 of the MLAB 32 and user data stored in the LUTRAM cells 50 may not be overwritten by the error detection/correction operation. In some embodiments, the dummy read scheme as illustrated in FIG. 9 may be implemented to all LUTRAM cells 50 of a sector 20 that includes multiple MLABs 32, and errors may thus not be detected in multiple MLABs 32. In some embodiments, multiple dummy read schemes as illustrated in FIG. 9 may be implemented to multiple regions (or columns 114) of LUTRAM cells 50 of a sector 20, such that at least one region or column 114 of LUTRAM cells 50 stores user data and provide dummy read values independently from another region or column 114 of LUTRAM cells 50 (e.g., in the same sector 20).

Figure 10:
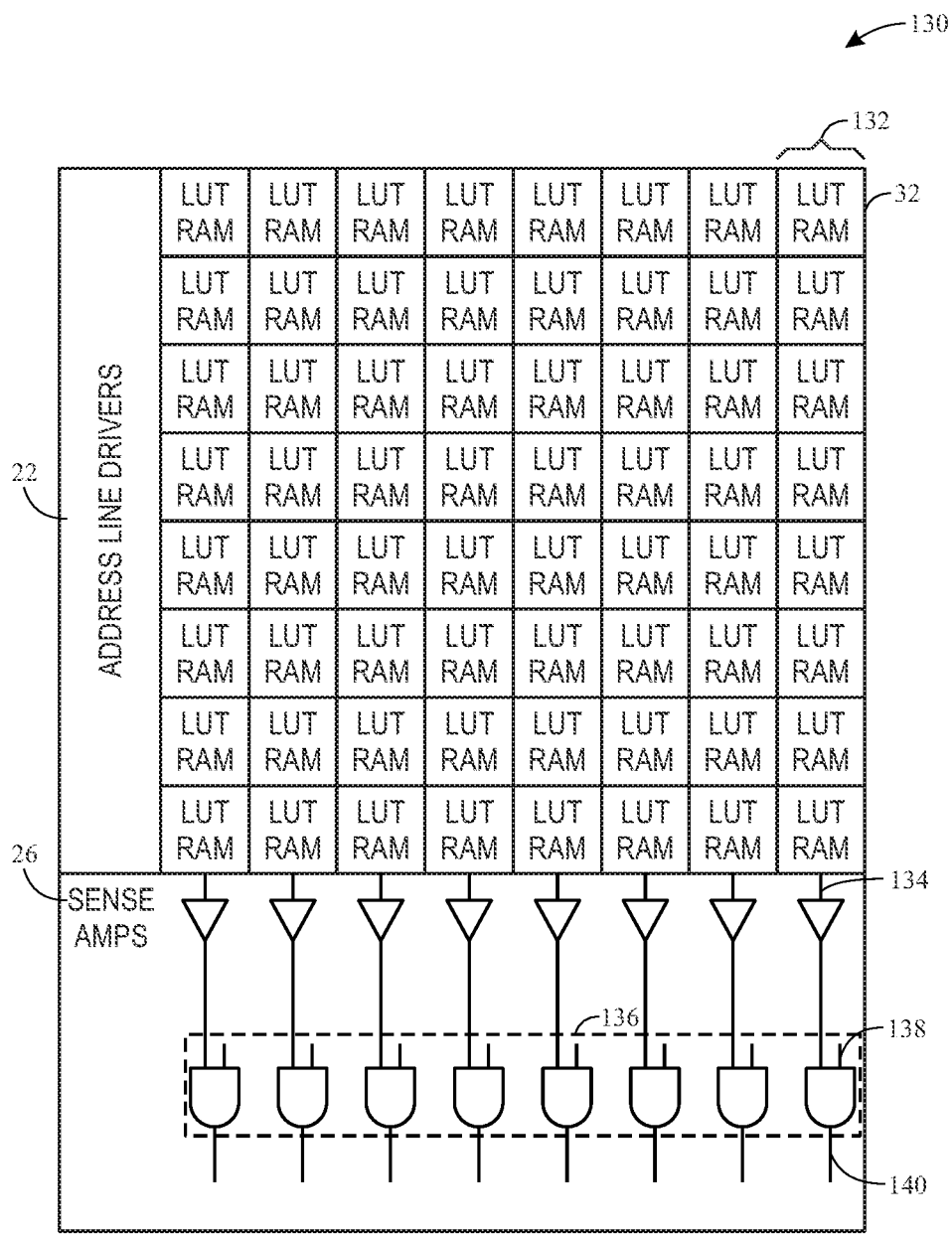
FIG. 10 is a schematic diagram of an array of memory cells that may store either configuration data or user data, in accordance with an embodiment of the present disclosure.

FIG. 10 is a schematic diagram of an array 130 of LUTRAM cells 50, in accordance with an embodiment of the present disclosure. In some embodiments, the array 130 of LUTRAM cells 50 corresponds to a sector 20 of the programmable logic fabric 18. Each column 132 of LUTRAM blocks 50 may share the transistor or gating logic 136 that provides the dummy read values during error detection/correction operations performed on the LUTRAM cell 50 when the LUTRAM cell 50 is used to store user data. A control signal 138 may be asserted when at least one LUTRAM cell 50 of the array 130 is operating in the RAM mode and an error detection/correction operation is being performed. In some embodiments, the array 130 (e.g., the sector 20) may be configured in the LUT mode or the RAM mode. The control signal 138 may then be based on the array 130 or sector 20 configuration. The data lines 134 of the columns 132 are pulled down, and reading the data lines 134 result in low values. The low value outputs 140 may then be sent for error detection/correction. Errors may thus not be detected in the array 130 or sector 20 of LUTRAM cells 50 and user data stored in the LUTRAM cells 50 may not be overwritten by the error detection/correction operation.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An integrated circuit device comprising:
 a first memory cell that stores data representative of configuration data when operating in a first mode, wherein the first memory cell stores data representative of user-accessible data when operating in a second mode and wherein the first memory cell is addressed by a first read address line;
 a second memory cell that stores a first value indicating whether the first memory cell is operating in the first mode or is operating in the second mode; and
 a switch coupled to the first memory cell and controlled by a switch logic configured to receive, during an error detection operation, the first value from the second memory cell and a read signal from the first read address line, wherein the switch provides a defined value to be read in place of the stored data of the first memory cell when the first value indicates that the first memory cell is operating in the second.

2. The integrated circuit device of claim 1, comprising a third memory cell that stores the data representative of the configuration data when operating in the first mode and wherein the third memory cell stores the data representative of the user-accessible data when operating in the second mode, wherein the third memory cell is addressed by a second read address line, wherein the switch logic is configured to receive the read signal from the second read address line, wherein the switch is coupled to the third memory cell, and wherein the switch provides the defined value to be read in place of the stored data of the third memory cell when the first value indicates that the first memory cell is operating in the second mode.

3. The integrated circuit device of claim 2, wherein the first and the third memory cells are in a column of the integrated circuit device.

4. The integrated circuit device of claim 2, wherein first and the third memory cells are in a sector of the integrated circuit device.

5. An integrated circuit device comprising:
 a first plurality of memory cells configured to store static data and configured to store dynamic data;
 a plurality of address lines, wherein each memory cell of the first plurality of memory cells is associated with a respective address line;
 a first identifier memory cell that stores a first value indicating whether the first plurality of memory cells is storing the static data or the dynamic data;
 a first switch logic configured to assert a control signal based on the first value when a respective first memory cell of the first plurality of memory cells is addressed using the respective address line during an error detection or correction operation; and
 a first transistor coupled to the respective first memory cell and to the switch logic wherein the first transistor provides a defined value to be read in place of the dynamic data stored in the respective first memory cell when the control signal is asserted.

6. The integrated circuit device of claim 5, wherein the static data comprises configuration data.

7. The integrated circuit device of claim 5, wherein the dynamic data comprises user data.

8. The integrated circuit device of claim 5, comprising a data register, wherein the data register comprises the first transistor.

9. The integrated circuit device of claim 5, wherein the defined value does not cause an error to be detected or corrected when read by the error detection or correction operation.

10. The integrated circuit device of claim 5, wherein the first transistor is electronically coupled to the respective first memory cell at a read port of the respective first memory cell.

11. The integrated circuit device of claim 5, wherein the first transistor is configured to cause a data line of the respective first memory cell to transmit a low value.

12. The integrated circuit device of claim 5, wherein the first transistor is an n-channel MOSFET (NMOS) pull-down transistor.

13. The integrated circuit device of claim 5, comprising:
 a second plurality of memory cells configured to store static data and configured to store dynamic data, wherein each memory cell of the second plurality of memory cells is associated with the respective address line of the plurality of address lines;
 a second identifier memory cell that stores a second value indicating whether the second plurality of memory cells is storing the static data or the dynamic data; and
 a second switch logic configured to assert a second control signal based on the second value when a respective second memory cell of the second plurality of memory cells is addressed using the respective address line during the error detection operation; and
 a second transistor coupled to the respective second memory cell and to the second switch logic, wherein the first transistor provides the defined value to be read in place of the dynamic data stored in the respective second memory cell when the second control signal is asserted.

\* \* \* \* \*